(12) United States Patent
Lin

(10) Patent No.: US 12,163,745 B2
(45) Date of Patent: Dec. 10, 2024

(54) HEAT DISSIPATION DEVICE AND FIN STRUCTURE

(71) Applicant: COOLER MASTER CO., LTD., Taipei (TW)

(72) Inventor: Chia-Yu Lin, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 0 days.

(21) Appl. No.: 17/845,911

(22) Filed: Jun. 21, 2022

(65) Prior Publication Data

US 2022/0316822 A1 Oct. 6, 2022

Related U.S. Application Data

(62) Division of application No. 16/442,381, filed on Jun. 14, 2019, now Pat. No. 11,402,163.

(30) Foreign Application Priority Data

Nov. 14, 2018 (TW) .................................. 107215438

(51) Int. Cl.
*F28F 13/12* (2006.01)

(52) U.S. Cl.
CPC ................................... *F28F 13/12* (2013.01)

(58) Field of Classification Search
CPC ...... F28F 13/12; F28F 3/00; F28F 3/02; F28F 1/128; H05K 7/20; H05K 7/2039; H01L 23/3672
USPC ....................................................... 165/80.3
See application file for complete search history.

(56) References Cited

U.S. PATENT DOCUMENTS

| 2,246,258 | A | 6/1941 | Lehman |
| 4,756,362 | A | 7/1988 | Kudoh et al. |
| 5,381,859 | A | 1/1995 | Minakami et al. |
| 5,582,244 | A | 12/1996 | Helms et al. |
| 6,273,186 | B1 | 8/2001 | Ognibene et al. |
| 6,340,056 | B1 | 1/2002 | Huang et al. |
| 6,415,855 | B2 * | 7/2002 | Gerard .................... F28F 3/027 165/146 |
| 6,550,529 | B1 | 4/2003 | Horng et al. |
| 6,901,993 | B2 | 6/2005 | Lee et al. |
| 7,121,327 | B2 | 10/2006 | Chen et al. |
| 7,304,847 | B2 | 12/2007 | Hwang et al. |
| 7,500,513 | B2 | 3/2009 | Zhang et al. |
| 8,291,964 | B2 * | 10/2012 | Hwang ............... H01L 23/3672 165/185 |
| 8,297,341 | B2 * | 10/2012 | Liang ................. H05K 7/20409 165/185 |

(Continued)

*Primary Examiner* — Gordon A Jones
(74) *Attorney, Agent, or Firm* — Merchant & Gould P.C.

(57) ABSTRACT

This disclosure relates to a fin structure including a main body and at least one minor structure. The main body includes a main plate and two side plates. The main plate has at least one through hole. The two side plates are respectively connected to two opposite sides of the main plate and protrude from the main plate. The at least one minor structure protrudes from the main plate and is located at a side of the main plate. The at least one minor structure is spaced apart from the two side plates. The at least one minor structure partially covers the at least one through hole. The at least one minor structure has a length, in a longitudinal direction of the main plate, less than a length of the at least one through hole of the main plate.

4 Claims, 17 Drawing Sheets

(56) References Cited

U.S. PATENT DOCUMENTS

| | | | |
|---|---|---|---|
| 8,325,480 B2 | 12/2012 | Bridges et al. | |
| 8,490,680 B2 | 7/2013 | Shen | |
| 9,854,706 B2 | 12/2017 | Chen et al. | |
| 10,220,431 B2* | 3/2019 | Mitsukawa | B21D 13/08 |
| 10,921,065 B2 | 2/2021 | Mahajan et al. | |
| 2002/0139515 A1 | 10/2002 | Azar | |
| 2006/0092613 A1* | 5/2006 | Kao | H01L 23/3672 |
| | | | 257/E23.099 |
| 2006/0124278 A1* | 6/2006 | Liu | F28F 3/02 |
| | | | 257/E23.103 |
| 2007/0137849 A1* | 6/2007 | Vackar | H01L 23/367 |
| | | | 257/722 |
| 2008/0115910 A1 | 5/2008 | Sheng | |
| 2008/0295994 A1 | 12/2008 | Lee et al. | |
| 2010/0018669 A1 | 1/2010 | Chen | |
| 2010/0132919 A1 | 6/2010 | Han et al. | |
| 2019/0116692 A1 | 4/2019 | Little et al. | |
| 2019/0383566 A1* | 12/2019 | Lu | F28F 13/06 |

* cited by examiner

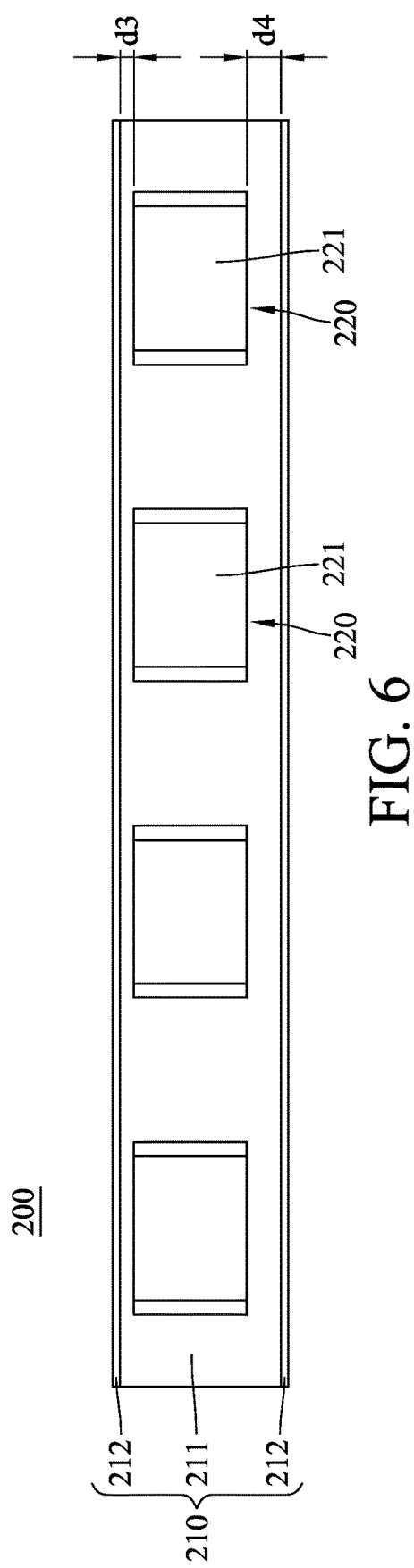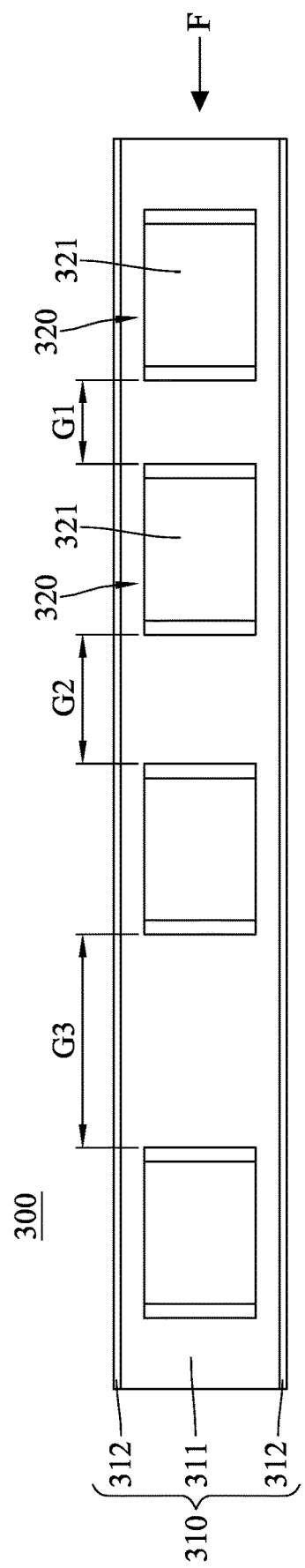
FIG. 6
FIG. 7

HEAT DISSIPATION DEVICE AND FIN STRUCTURE

CROSS-REFERENCE TO RELATED APPLICATIONS

This patent application is a divisional patent application of U.S. patent application Ser. No. 16/442,381 filed on Jun. 14, 2019 and entitled "HEAT DISSIPATION DEVICE AND FIN STRUCTURE", which is a non-provisional application claims priority under 35 U.S.C. § 119(a) on Patent Application No(s). 107215438 filed in Taiwan, R.O.C. on Nov. 14, 2018, the entire contents of which are hereby incorporated by reference.

TECHNICAL FIELD

The present disclosure relates to a heat dissipation device having fins, more particularly to a heat dissipation device having a more efficient extended surface structure.

BACKGROUND

In a computer system, an integrated circuit (IC) such as a central processing unit, a north bridge chip, a south bridge chip and a graphics chip of a motherboard generally generate a large amount heat. In order to quickly remove the heat, some users may lean to use a liquid-cooled cooling system instead of an air-cooled cooling system. The conventional liquid-cooled cooling system may include a water block and a water radiator connected to each other. The water block is in thermal contact with the heat source to absorb the heat, and then the heat will be dissipated by the water radiator.

In order to further improve the heat dissipation efficiency, the conventional liquid-cooled cooling system may further contain fins added to the water block. In detail, the conventional fins are usually arranged side by side so as to form flow channels therebetween. In this case, there is no feature in the flow channel to interfere with the coolant so that the coolant has a slower velocity and less turbulence, thereby having a less heat transfer. As a result, the heat exchange efficiency may be insufficient in the conventional fin structures.

Adding internal fins always increases velocity because they decrease the area for flow. If a constant volume of fluid has to pass through a smaller channel, velocity must increase. Furthermore, the increasing of velocity may cause velocity fluctuation, also known as turbulence, which has a larger cross-sectional area for flow. Therefore, internal fins in the flow channel accelerate the fluid velocity, cause turbulence and increase the area available for heat transfer, thus increasing the heat exchange efficiency, but adding more fins decreases the distance between fins making the heat sink more susceptible to blockage caused by particles in the coolant. To avoid fluid blockage, some use fewer fins in order to obtain a greater distance between the fins. However, this also decreases the total surface area of the fins in the flow channel and decreases fluid velocity, thereby decreasing heat transfer.

For example, an electronic device for controlling a self-driving car is usually populated with a group of cold plates for heat dissipation, and each cold plate contains internal fins to absorb more heat. However, particles or debris caused by the movable parts of the car may flow into the circulation to block the narrow gaps between the internal fins.

SUMMARY

The present disclosure provides a heat dissipation device and a fin structure that increases the heat exchange efficiency for a given fin gap.

According to one aspect of the present disclosure, a fin structure includes a main body and at least one minor structure. The main body includes a main plate and two side plates. The two side plates are respectively connected to two opposite sides of the main plate and protrude from the main plate. The at least one minor structure protrudes from the main plate and is located at a side of the main plate. The at least one minor structure is spaced apart from the two side plates.

According to another aspect of the present disclosure, a heat dissipation device includes a plurality of fin structures. The plurality of fin structures each include a main body and at least one minor structure. Two of the plurality of the fin structures are connected so as to form a channel. The at least one minor structure connected to the main body is located in the channel. The at least one minor structure of one of the plurality of fin structures is spaced apart from the main body of another one of the plurality of fin structures.

According to the heat dissipation device and the fin structure discussed above, the minor structure protrudes from the main body and does not overlap with another main body. This configuration can cause the fluid to become a turbulent flow so as to increase the heat exchange efficiency. Also, in one embodiment, the maximum distance is large enough to prevent particles or debris in the fluid from blocking the channel.

Moreover, the minor structures of the fin structures do not interfere with the adjacent main bodies, such that it would be easy and convenient to connect the fin structures and modify the shape of the minor structure. The fin structures may be assembled by, for example, welding.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein:

FIG. 6 is a front view of a fin structure according to a second embodiment of the present disclosure;

FIG. 7 is a front view of a fin structure according to a third embodiment of the present disclosure;

DETAILED DESCRIPTION

Figure 1:
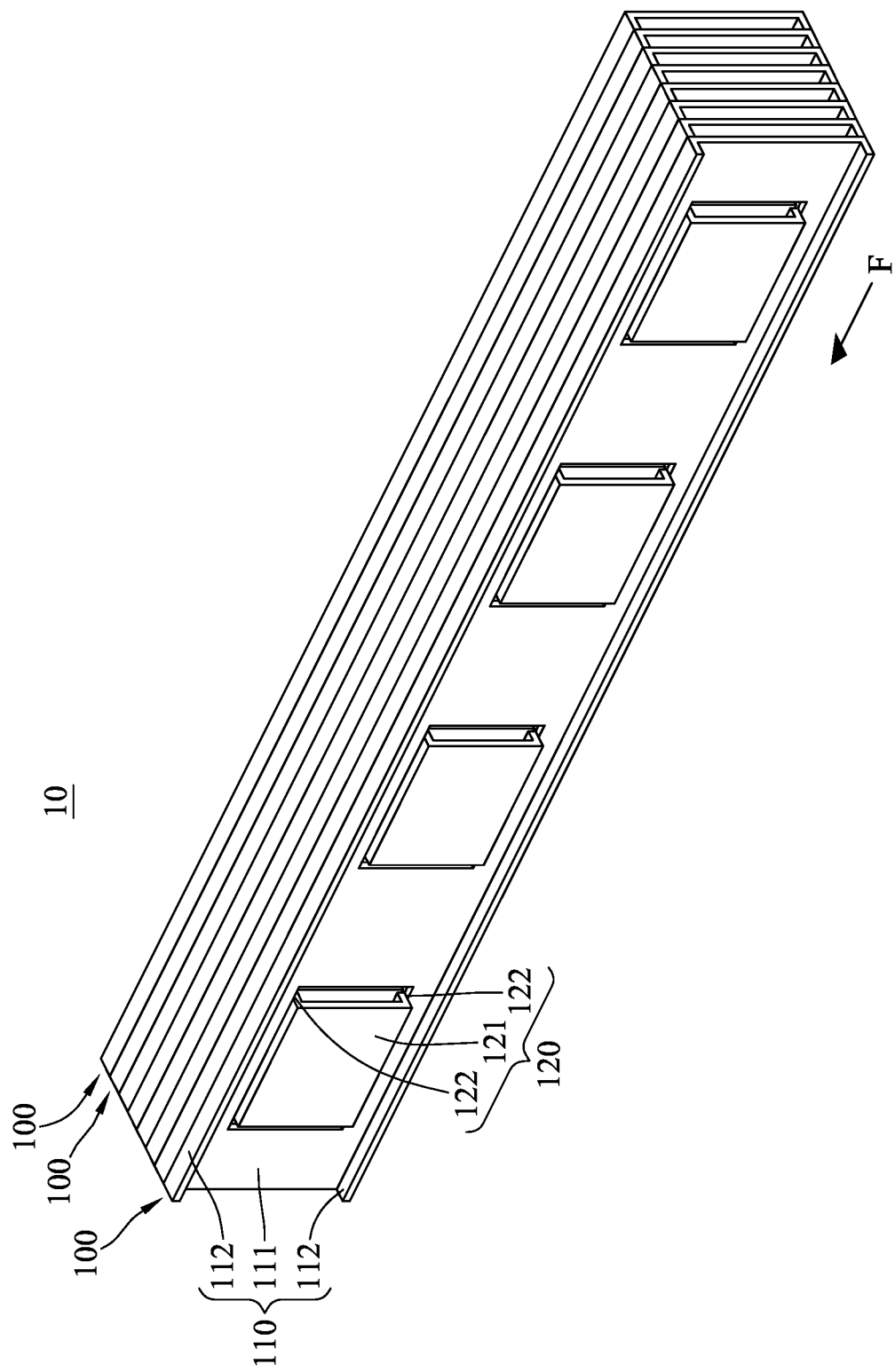
FIG. 1 is a perspective view of a heat dissipation device according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
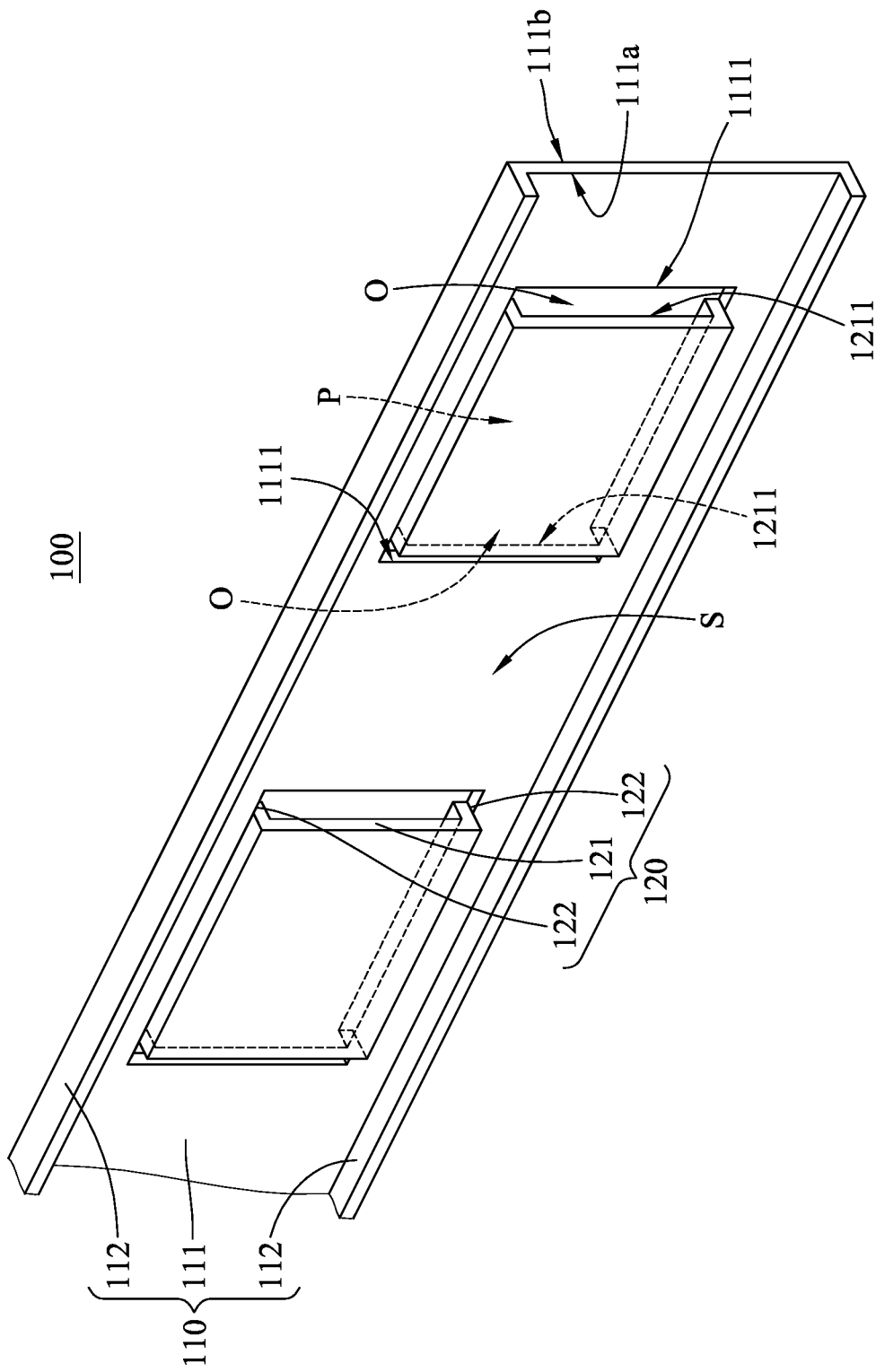
FIG. 2 is a partially perspective view of a fin structure of the dissipation device in FIG. 1.

Please refer to FIG. 1 to FIG. 2, wherein FIG. 1 is a perspective view of a heat dissipation device according to a first embodiment of the present disclosure, and FIG. 2 is a partially perspective view of a fin structure of the dissipation device in FIG. 1.

This embodiment provides a heat dissipation device 10 disposed in, for example, a water block (not shown in figures). The heat dissipation device 10 includes a plurality of fin structures 100. These fin structures 100 can be connected to one another so as to form a channel S therebetween for fluid (not shown in figures) flowing through the fin structure 100 along a flow direction F. Each of the fin structures 100 includes a main body 110 and at least one minor structure 120. The minor structure 120 is disposed on the main body 110, is located in the channel S, and is spaced apart from each other. Further, in the heat dissipation device 10, the minor structures 120 of one of the fin structures 100 are spaced apart from the main body 110 of the adjacent fin structure 100.

These fin structures 100 basically have the same design; thus only one of them will be described in detail below. In this embodiment, the main body 110 of the fin structure 100 may further include a main plate 111 and two side plates 112. The main plate 111 has a first surface 111a and a second surface 111b opposite to each other. The two side plates 112 are respectively connected to two opposite sides of the main plate 111 and protrude from the first surface 111a of the main plate 111. Moreover, the main plate 111 has a plurality of through holes P and a plurality of first edges 1111. The first edges 1111 are located at two opposite sides of the through hole P and are not directly connected to the minor structure 120, and the first edge 1111 is substantially orthogonal to a longitudinal edge L of the main plate 111, but the disclosure is not limited thereto. In some other embodiments, the first edge may be at an acute angle with respect to the longitudinal edge L.

Each of the minor structures 120 protrudes from the first surface 111a of the main plate 111 and may be made by, for example, a stamping process. The minor structures 120 each include a diversion part 121 and two connecting parts 122. The diversion part 121 has a rectangular shape and is substantially parallel to the main plate 111. Two opposite sides of the diversion part 121 are respectively connected to the main plate 111 via the two connecting parts 122, and each of the other two opposite sides of the diversion part 121 and the main plate 111 have an opening O therebetween. Specifically, the diversion part 121 has two second edges 1211 that are respectively located at two opposite sides of the diversion part 121 and are not directly connected to the main plate 111. Also, the second edges 1211 are substantially orthogonal to the longitudinal edge L of the main plate 111, but the disclosure is not limited thereto. In some other embodiments, the second edges may be at an acute angle with respect to the longitudinal edge L. The opening O is surrounded by the second edges 1211 of the diversion part 121 and the first edges 1111.

Figure 3:
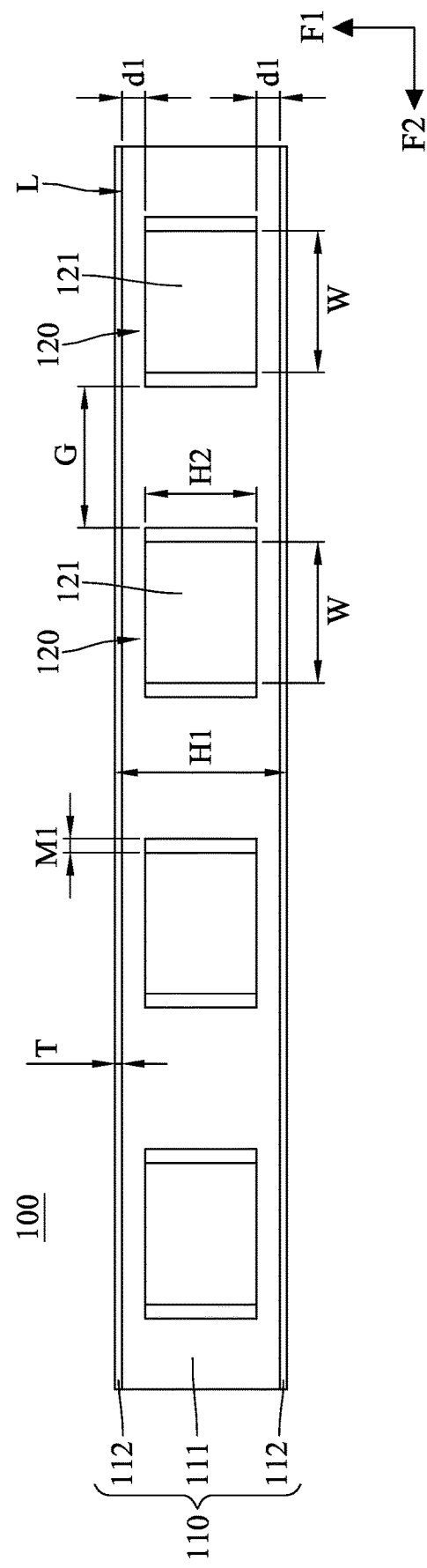
FIG. 3 is a front view of the fin structure in FIG. 2.

Please refer to FIG. 3, which is a front view of the fin structure in FIG. 2. A side length H1 of the main plate 111 is larger than a side length H2 of the diversion part 121 in a direction F1, and the minor structure 120 is spaced apart from the two side plates 112. Specifically, in this embodiment, the side length H1 of the main plate 111 minus six times of the thickness T of the side plate 112 substantially equals to the side length H2 of the diversion part 121, but the disclosure is not limited thereto.

In this embodiment, each of the diversion parts 121 is spaced apart by a distance d1 from either one of the side plates 112. In addition, the diversion parts 121 have the same side length W in a direction F2, and the direction F2 is perpendicular to the direction F1. Further, the diversion parts 121 of each fin structure 100 have the same interval G; that is, on each fin structure 100, every two adjacent the diversion parts 121 are spaced apart by the same distance. As shown in the figure, the interval G is measured in the direction F2, and all of the intervals G have the same value.

Figure 4:
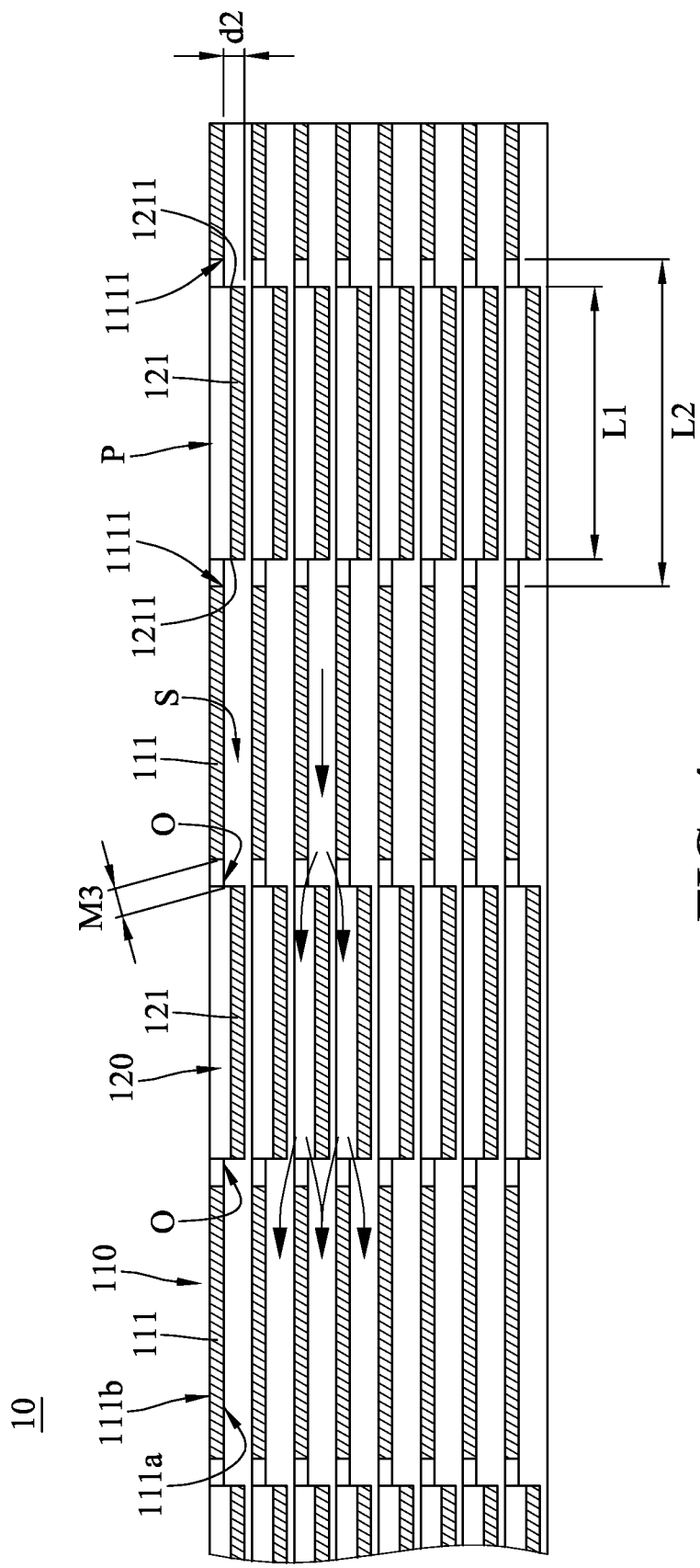
FIG. 4 is a partially cross-sectional top view of the heat dissipation device in FIG. 1.

Please refer to FIG. 4, which is a partially cross-sectional top view of the fin structures 100 connected to one another, that is a cross-sectional top view of the heat dissipation device in FIG. 1. Among these fin structures 100, the minor structures 120 do not overlap with the main plates 111. And all of the minor structures 120 protrude from the first surface 111a of the main plate 111 by the same distance d2. As indicated by the arrows, while the fluid flows along the channels S, the fluid will be repeatedly divided into two and thus becoming a turbulent flow. This configuration forces the fluid to flow toward the first surface 111a, second surface 111b of the main plate 111 and side surfaces of the diversion part 121, thereby increasing the heat exchange efficiency of the heat dissipation device 10.

In addition, the openings O do not extend to the side plates 112. Therefore, the fin structure 100 has a decent structural strength while having the configuration to achieve the above turbulent flow.

Moreover, the minor structures 120 of the fin structures 100 do not interfere with the adjacent main bodies 110, such that it would be easy and convenient to connect the fin structures 100 and possible to modify the shape of the minor structure 120. In this or other embodiments, the fin structures 100 are assembled by, for example, welding, but the disclosure is not limited thereto.

In some other embodiments, the minor structures and the side plates may protrude from different surfaces.

Figure 5:
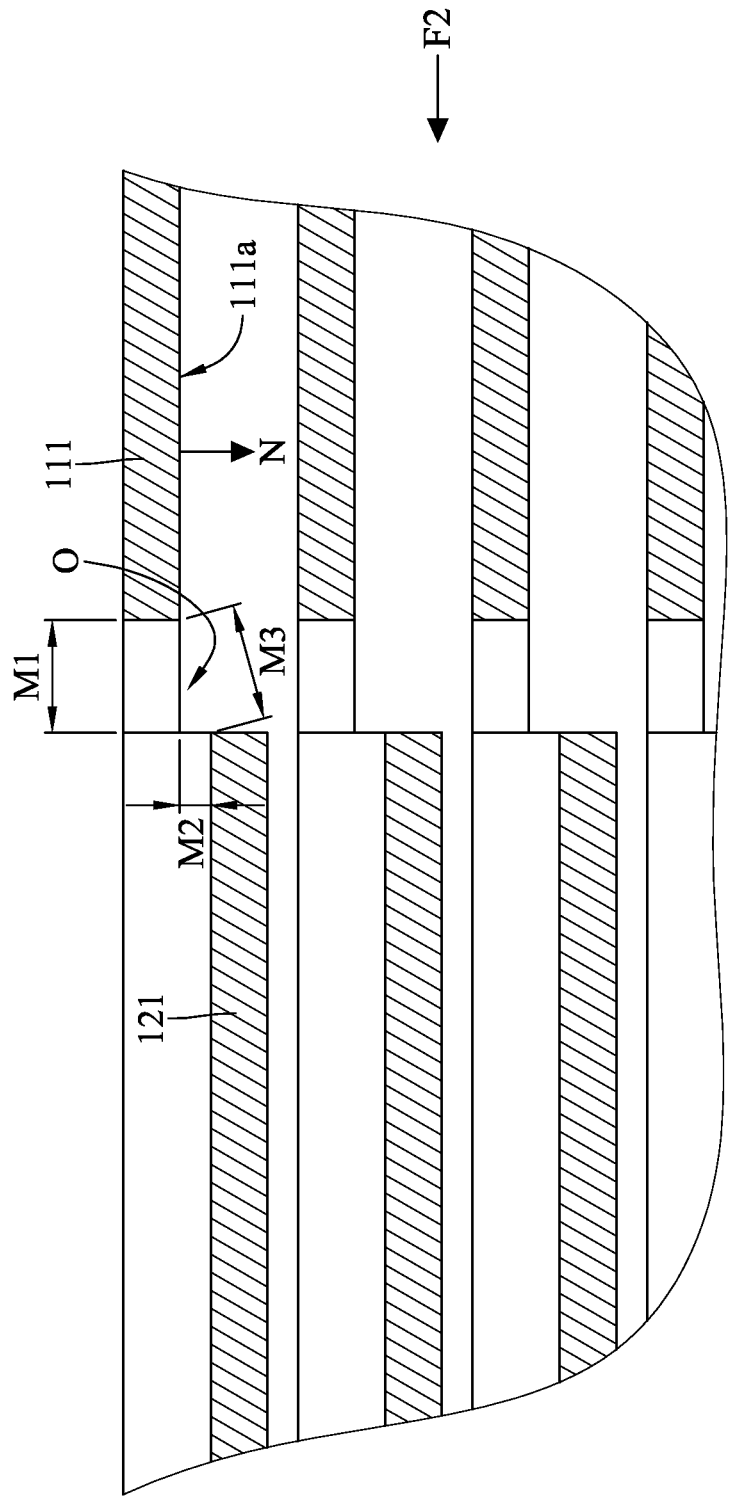
FIG. 5 is a partially enlarged cross-sectional top view of the heat dissipation device in FIG. 4.

Further, as shown in FIG. 3 and FIG. 4, a length L1 of the diversion part 121 of the minor structure 120 along a direction F2 parallel to the longitudinal edge L of the main plate 111 is less than a length L2 of the through hole P, and an orthogonal projection of the diversion part 121 onto the main plate 111 is located between the two adjacent first edges 1111. As shown in FIG. 3, in the direction F2, the second edge 1211 of the diversion part 121 and the first edge 1111 of the main plate 111 are spaced apart by a distance M1. Furthermore, as shown in FIG. 4 and FIG. 5, which FIG. 5 is a partially enlarged cross-sectional top view of the heat dissipation device in FIG. 4, the main plate 111 and the diversion part 121 are spaced apart by a distance M2 along a normal direction N of the first surface 111a, and define a maximum distance M3 between the second edge 1211 of the minor structure 120 and the adjacent first edge 1111 of the main plate 111; the maximum distance M3 is larger than the distance M2 and is less than the sum of the distance M1 and the distance M2. And the maximum distance M3 is large enough to prevent particles from blocking the channel S, thereby securing a smooth flow of the fluid. For example, the particles may have a diameter of 0.5 to 0.6 mm, and the maximum distance M3 may be designed slightly larger than 0.60 mm. As a result, the particles can flow through the maximum distance M3 and the channel S may not be blocked. Therefore, it is no need to use the fewer fin structures 100 than convention, thus keeping the total surface area of the fin structures 100 in the channel S. Note that actual value of the maximum distance M3 is not limited and can be altered in accordance with the size of particles.

In short, in this embodiment, adjusting the length L1 of the diversion part 121 is able to obtain a desired distance to both the main plate 111 and the adjacent main plate 111, thereby effectively preventing particles from blocking the channel S. As a result, there is no need to change or decrease the spacing between the main plates 111 since the larger distance between the adjacent main plates 111 would lower the density of the main plates 111 in a specific size of the heat dissipation device 10 and thus decreasing the heat exchange efficiency.

Note that the disclosure is not limited by the appearance of the fin structure 100. In fact, the appearance of the fin structure may be modified in accordance with the location and/or type of the heat source. Please refer to FIG. 6, which is a front view of a fin structure according to a second embodiment of the present disclosure. In this embodiment, a main body 210 of a fin structure 200 may further include a main plate 211 and two side plates 212. The side plates 212 are respectively connected to two opposite sides of the main plate 211. Each minor structure 220 is made by, for example, a stamping process and may further include a diversion part 221. The diversion part 221 has a rectangular shape. Two opposite sides of the diversion part 221 are respectively connected to the main plate 211. In this embodiment, the diversion part 221 of the minor structure 220 is spaced apart from the side plates 212 by different distances. Specifically, each the diversion part 221 is spaced apart from one of the side plates 212 by a distance d3 and is spaced apart from another one of the two side plates 212 by a distance d4, and the distance d4 is different from the distance d3.

Please refer to FIG. 7, which is a front view of a fin structure according to a third embodiment of the present disclosure.

In this embodiment, a main body 310 of a fin structure 300 may further include a main plate 311 and two side plates 312. The side plates 312 are respectively connected to two opposite sides of the main plate 311. Each minor structure 320 is made by, for example, a stamping process and may further include a diversion part 321. The diversion part 321 has a rectangular shape. Two opposite sides of the diversion part 321 are respectively connected to the main plate 311. In this embodiment, the intervals between the diversion parts 321 of the minor structures 320 increase along a flow direction F which is defined as a direction from the inflow side to the outflow side. In detail, the intervals between the diversion parts 321, along the flow direction F, are sequentially G1, G2 and G3. The interval G1 is smaller than the interval G2, and the interval G2 is smaller than the interval G3, but the disclosure is not limited thereto. In some other embodiments, the intervals of the diversion parts may decrease along the flow direction.

Figure 8:
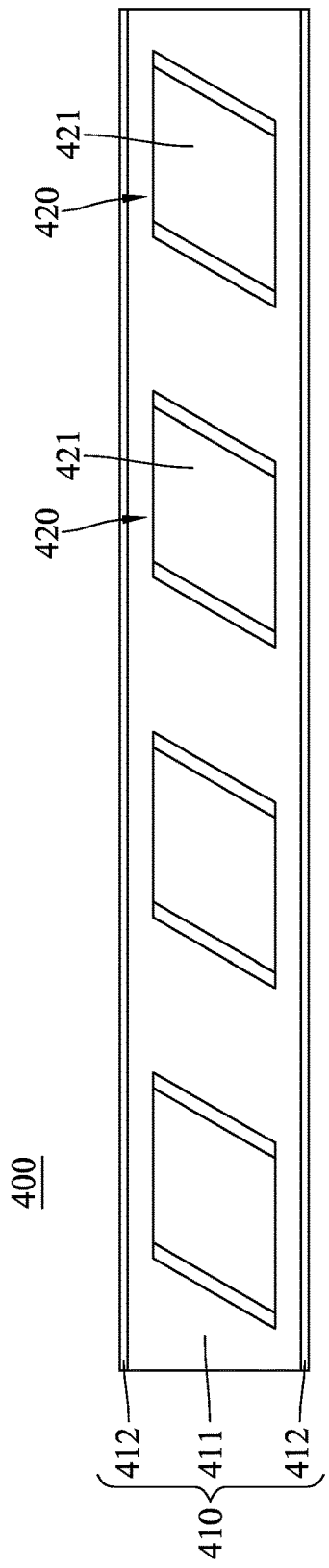
FIG. 8 is a front view of a fin structure according to a fourth embodiment of the present disclosure.

Please refer to FIG. 8, which is a front view of a fin structure according to a fourth embodiment of the present disclosure.

In this embodiment, a main body 410 of a fin structure 400 may further include a main plate 411 and two side plates 412. The side plates 412 are respectively connected to two opposite sides of the main plate 411. Each minor structure 420 is made by, for example, a stamping process and may further include a diversion part 421. The diversion part 421 has a parallelogram shape. Two opposite sides of the diversion part 421 are respectively connected to the main plate 411.

Figure 9:
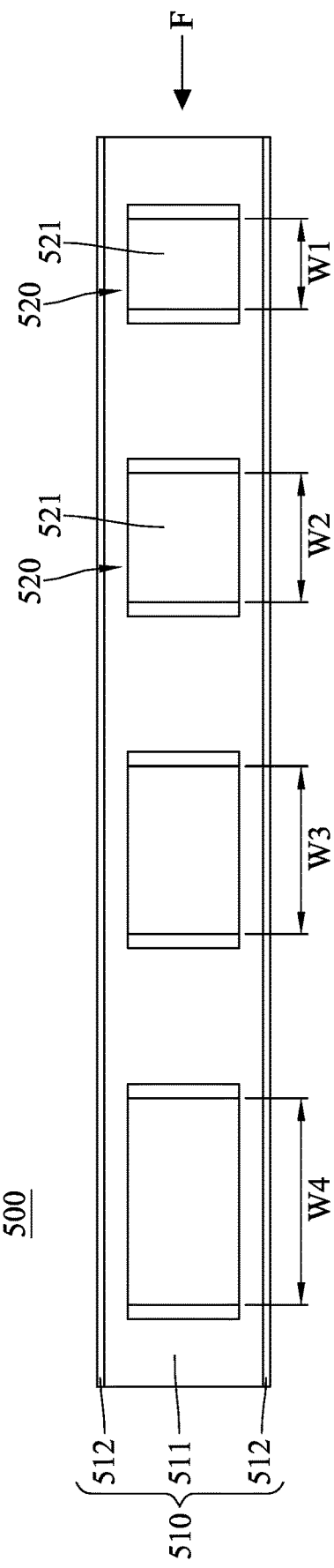
FIG. 9 is a front view of a fin structure according to a fifth embodiment of the present disclosure.

Please refer to FIG. 9, which is a front view of a fin structure according to a fifth embodiment of the present disclosure.

In this embodiment, a main body 510 of a fin structure 500 may further include a main plate 511 and two side plates 512. The side plates 512 are respectively connected to two opposite sides of the main plate 511. Each minor structure 520 is made by, for example, a stamping process and may further include a diversion part 521. The diversion part 521 has a rectangular shape. Two opposite sides of the diversion part 521 are respectively connected to the main plate 511. In this embodiment, the minor structures 520, in a flow direction, are different in side length. In detail, the distances of the diversion parts 521 of the minor structures 520 are sequentially W1, W2, W3 and W4, wherein the distance W1 is smaller than distance W2, distance W2 is smaller than distance W3, and distance W3 is smaller than W4.

Figure 10:
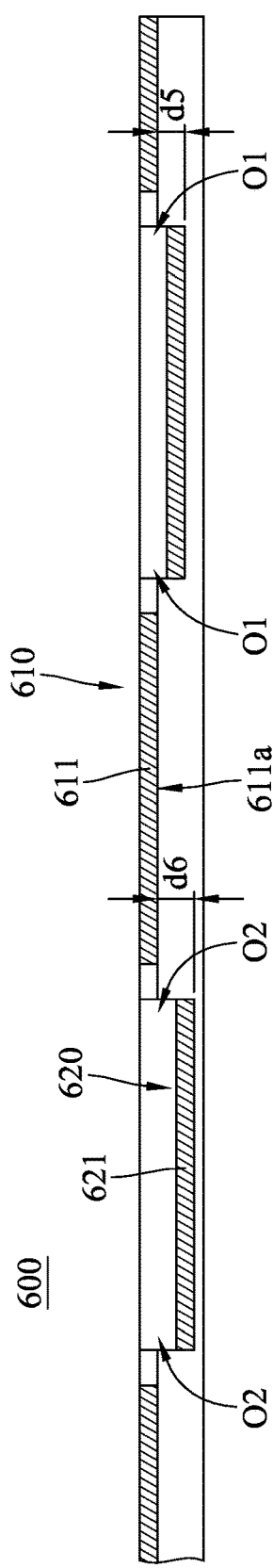
FIG. 10 is a partially cross-sectional top view of a fin structure according to a sixth embodiment of the present disclosure.

Please refer to FIG. 10, which is a partially cross-sectional top view of a fin structure according to a sixth embodiment of the present disclosure. In this embodiment, a main body 610 of a fin structure 600 may further include a main plate 611, and the main plate 611 may further include a first surface 611a. Each minor structure 620 protrudes from the first surface 611a of the main plate 611 and may further include a diversion part 621. The diversion parts 621 of the minor structures 620 protrude from the first surface 611a of the main plate 611 by different distances d5 and d6.

Figure 11:
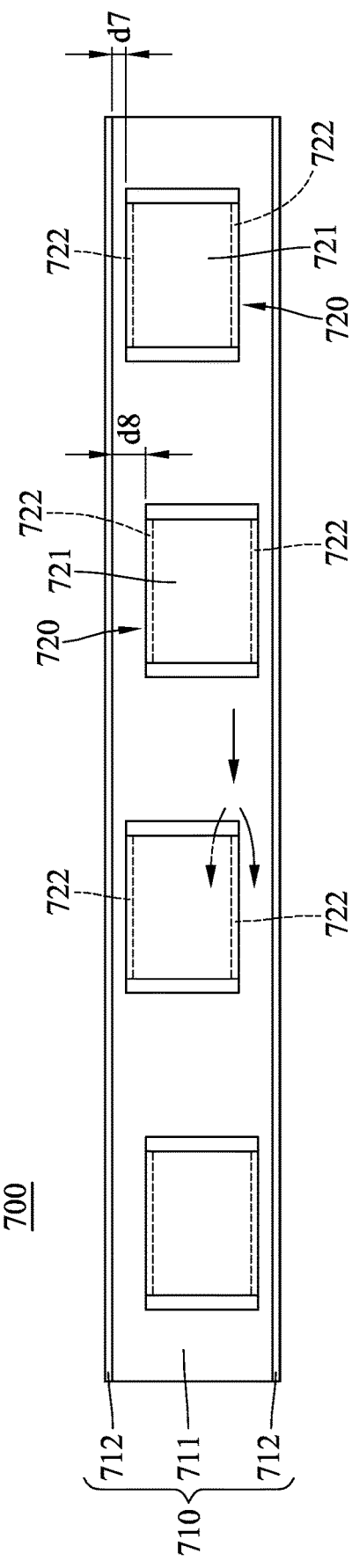
FIG. 11 is a front view of a fin structure according to a seventh embodiment of the present disclosure.

Please refer to FIG. 11, which is a front view of a fin structure according to a seventh embodiment of the present disclosure. In this embodiment, a main body 710 of a fin structure 700 may further include a main plate 711 and two side plates 712. The side plates 712 are respectively connected to two opposite sides of the main plate 711. Each minor structure 720 is made by, for example, a stamping process and may further include a diversion part 721 and two connecting parts 722. The diversion part 721 has a rectangular shape. Two opposite sides of the diversion part 721 are respectively connected to the main plate 711. In this embodiment, the diversion parts 721 of two of the minor structures 720 are respectively spaced apart from one of the two side plates 712 by different distances d7 and d8. In detail, the diversion part 721 of one of the minor structures 720 is spaced apart from one of the two side plates 712 by a distance d7, and the diversion part 721 of another one of the minor structures 720 is spaced apart from the one of the two side plates 712 by a distance d8 which is different from distance d7.

As indicated by the arrows, while the fluid flows along the channel S, the fluid will be repeatedly divided into two by the connecting part 722 and thus becoming a turbulent flow. In contrast, the fluid may also become turbulent by the diversion part 721 and the main part 711 as the aforementioned embodiment.

Figure 12:
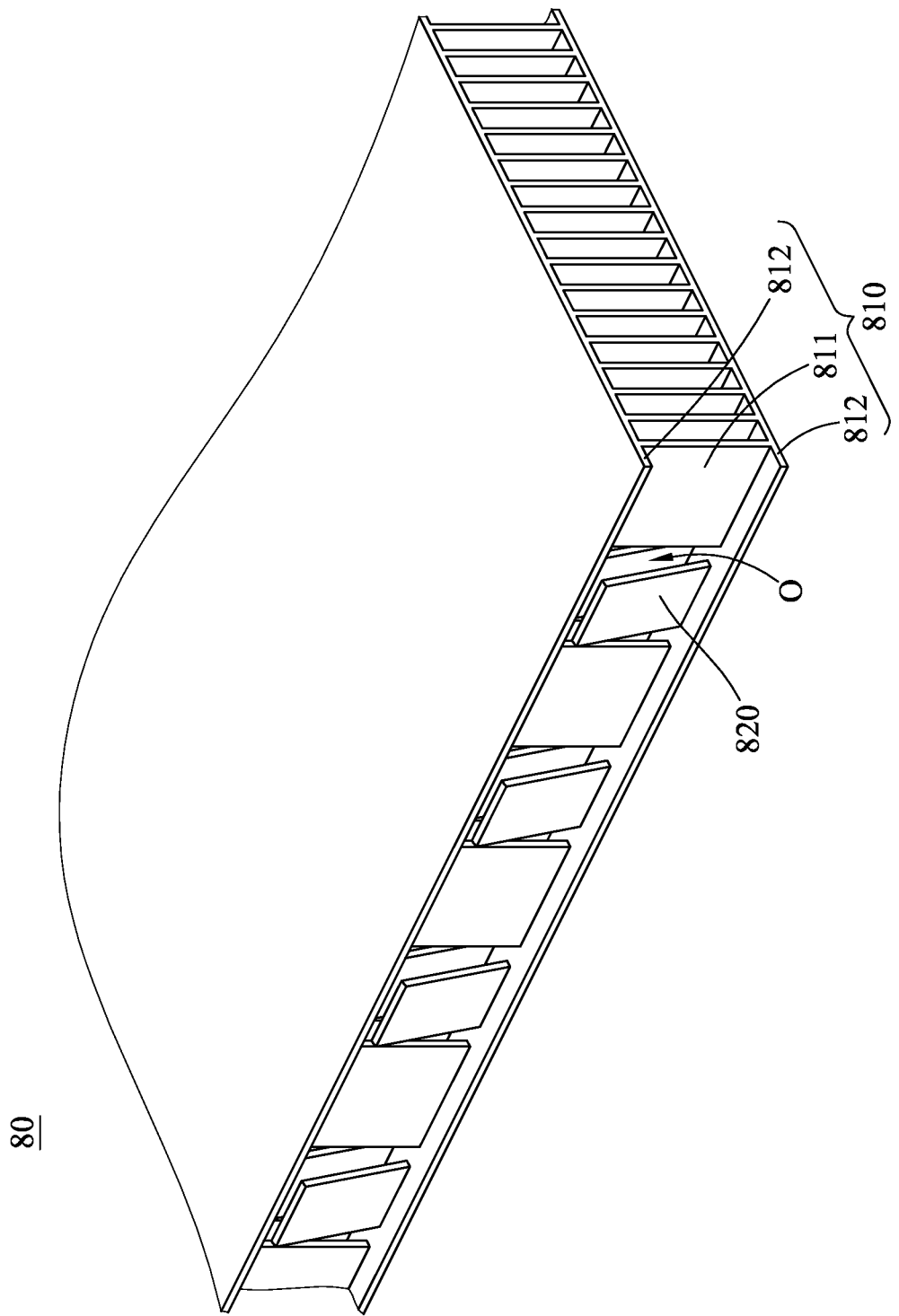
FIG. 12 is a partially enlarged perspective view of a heat dissipation device according to an eighth embodiment of the present disclosure.
Figure 13:
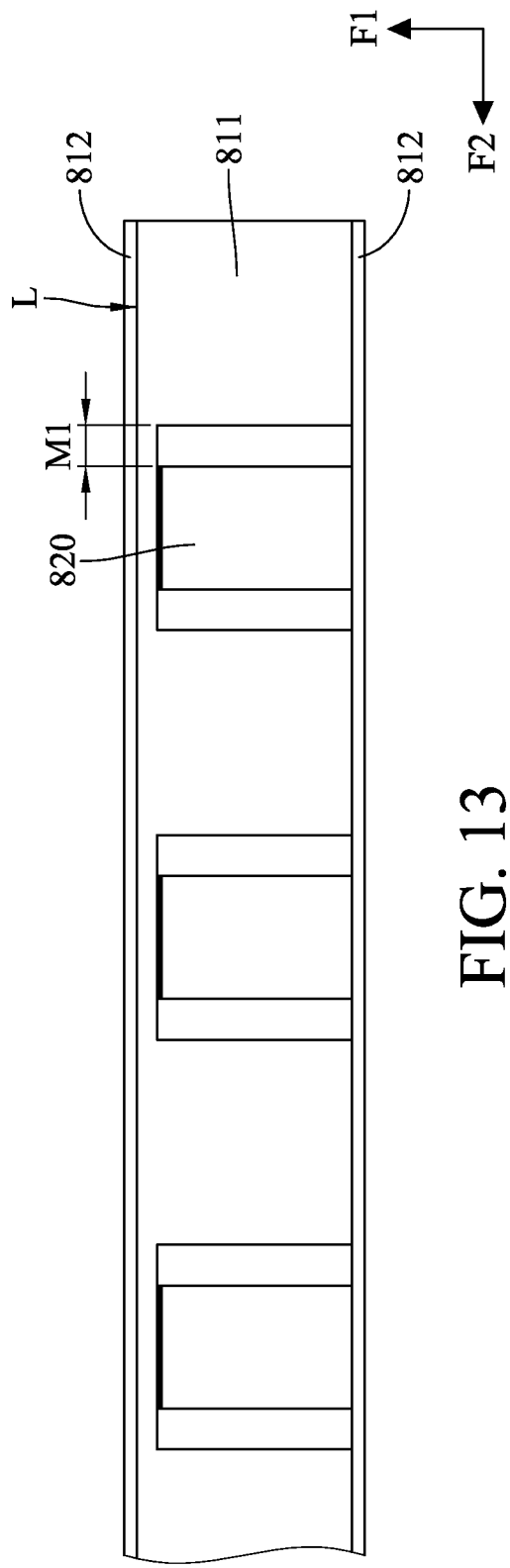
FIG. 13 is a partially enlarged front view of the heat dissipation device in FIG. 12.
Figure 14:
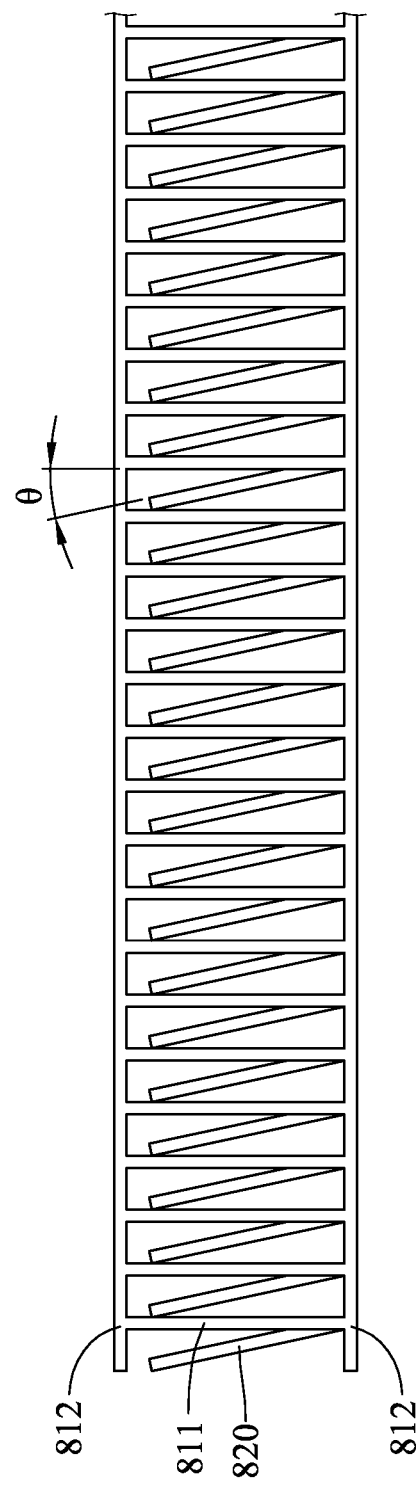
FIG. 14 is a partially enlarged side view of the heat dissipation device in FIG. 12.
Figure 15:
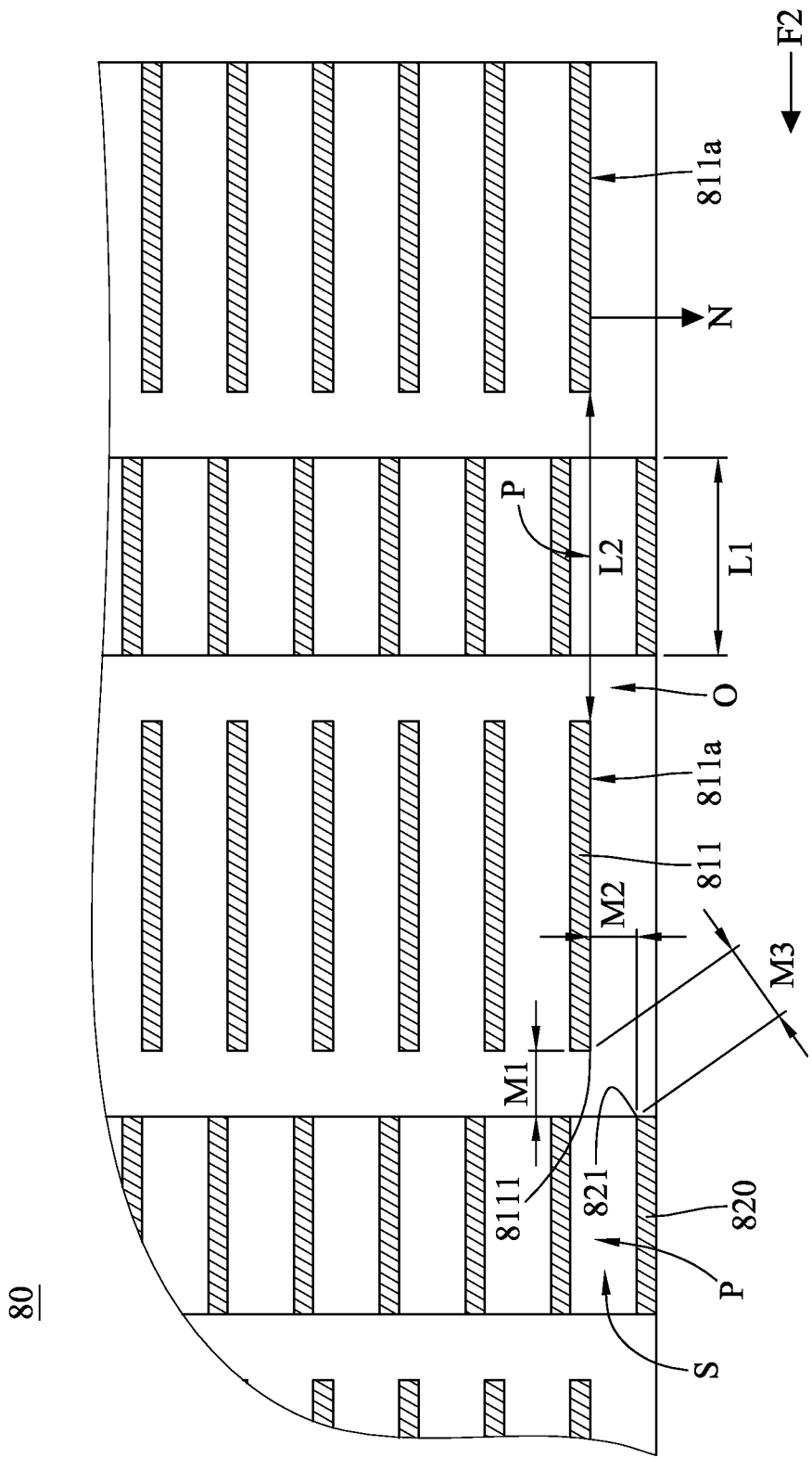
FIG. 15 is a partially enlarged cross-sectional top view of the heat dissipation device in FIG. 12.

Please refer to FIG. 12 to FIG. 15, FIG. 12 is a partially enlarged perspective view of a heat dissipation device according to an eighth embodiment of the present disclosure, FIG. 13 is a partially enlarged front view of the heat dissipation device in FIG. 12, FIG. 14 is a partially enlarged side view of the heat dissipation device in FIG. 12, and FIG. 15 is a partially enlarged cross-sectional top view of the heat dissipation device in FIG. 12.

As shown in FIG. 12, in this embodiment, the heat dissipation device 80 includes a main body 810 and a plurality of minor structures 820. The main body 810 includes a plurality of main plates 811 and two side plates 812. The side plates 812 are respectively connected to two opposite sides of each of the main plates 811. Each of the minor structures 820 is disposed on one of the side plates 812 and is located at a side of one of the main plates 811.

As shown in FIG. 13 to FIG. 15, the main plate 811 each have a plurality of through holes P and a plurality of first edges 8111. The first edges 8111 are located at two opposite sides of the through holes P, and the first edge 8111 is substantially orthogonal to the longitudinal edge L of the main plate 811. The minor structure 820 has two second edges 821 respectively located at two opposite sides of the minor structure 820 and are not directly connected to the main plate 811. And the second edge 821 is also substantially orthogonal to the longitudinal edge L.

In this embodiment, the minor structure 820 are not parallel to the main plate 811. Specifically, the minor structure 820 is at angle θ to the main plate 811. Moreover, a length L1 of the minor structure 820 along a direction F2 parallel to the longitudinal edge L of the main plate 811 is less than a length L2 of the through hole P, and an orthogonal projection of the minor structure 820 onto the main plate 811 is located between the two adjacent first edges 8111. As shown in FIG. 13, in the direction F2, the second edge 821 of the minor structure 820 and the first edge 8111 of the main plate 811 are spaced apart by a distance M1.

In this embodiment, the minor structure 820 is not parallel to the main plate 811. Specifically, the minor structure 820 is at an acute angle with respect to the main plate 811.

In this embodiment, as shown in FIG. 15, the main plate 811 and the minor structure 820 are spaced apart by a distance M2 along a normal direction N of a first surface 811a of the main plate 811, and define a maximum distance M3 between the second edge 821 of the minor structure 820 and the adjacent first edge 8111 of the main plate 811; the maximum distance M3 is larger than the distance M2 and is less than the sum of the distance M1 and the distance M2.

And the maximum distance M3 is large enough to prevent particles from blocking the channel S, thereby securing a smooth flow of the fluid. For example, the particles may have a diameter of 0.5 to 0.6 mm, and the maximum distance M3 may be designed slightly larger than 0.60 mm. As a result, the particles can flow through the maximum distance M3 and the channel S may not be blocked. Therefore, it is no need to use the fewer main plates 811 than convention, thus keeping the total surface area of the main plates 811 in the channel S. Note that the actual value of the maximum distance M3 is not limited and can be altered in accordance with the size of the particles.

In short, in this embodiment, adjusting the length L1 of the minor structure 820 is able to obtain a desired distance to both the main plate 811 and the adjacent main plate 811, thereby effectively preventing particles from blocking the channel S. As a result, there is no need to change or decrease the spacing between the main plates 811 since the larger distance between the adjacent main plates 811 would lower the density of the main plates 811 in a specific size of the heat dissipation device 80 and thus decreasing the heat exchange efficiency.

Furthermore, in this embodiment, the heat dissipation device 80 is made of a single-piece, but the present disclosure is not limited thereto. In some other embodiments, the heat dissipation device may be assembled by a plurality of pieces.

Figure 16:
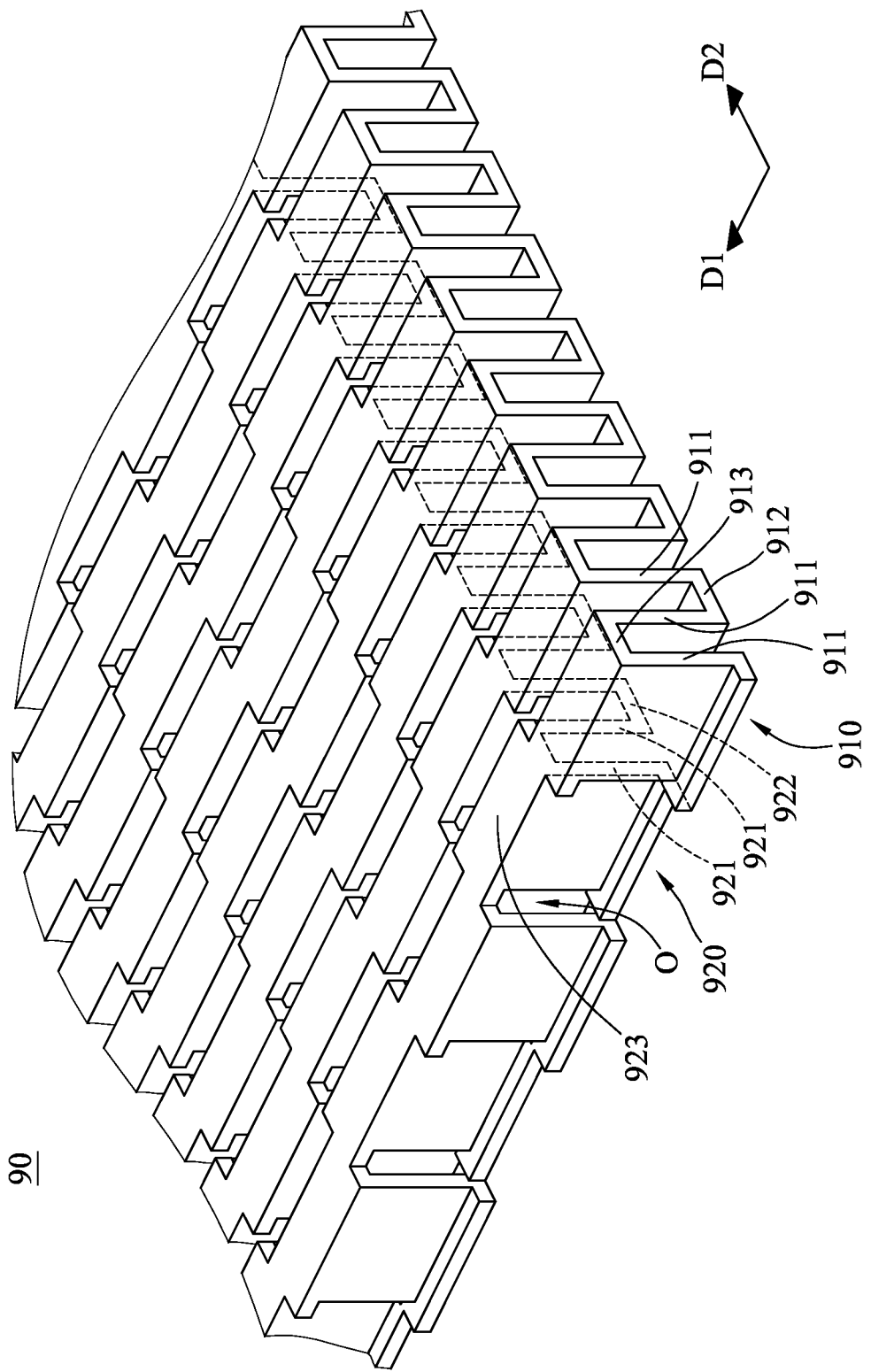
FIG. 16 is a partially enlarged perspective view of a heat dissipation device according to a ninth embodiment of the present disclosure.
Figure 17:
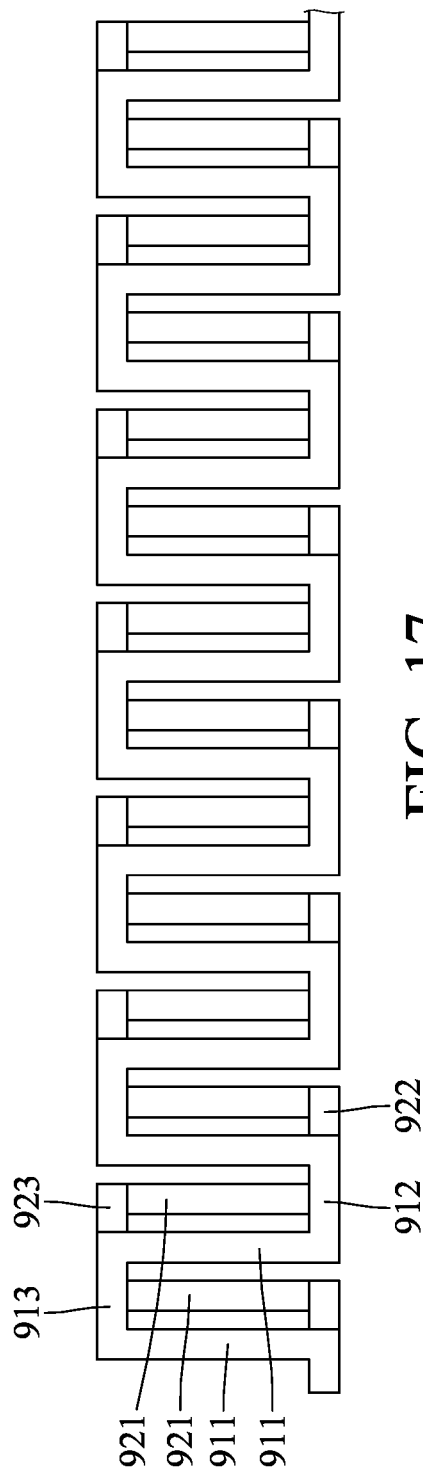
FIG. 17 is a partially enlarged side view of the heat dissipation device in FIG. 16.
Figure 18:
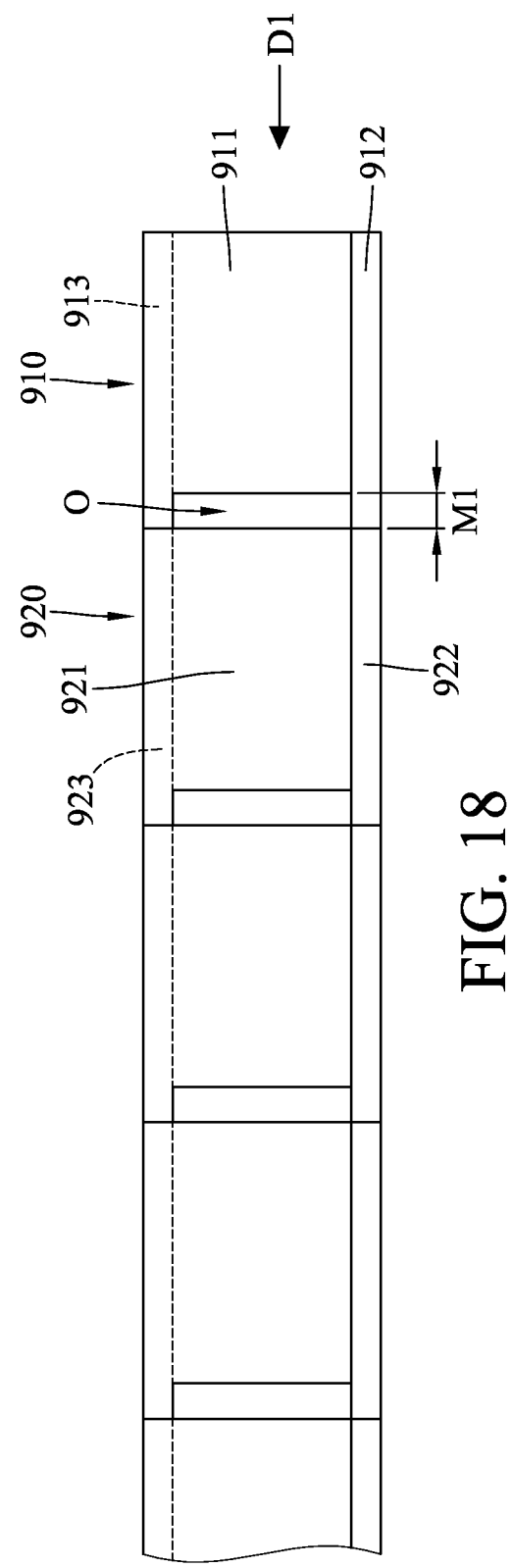
FIG. 18 is a partially enlarged front view of the heat dissipation device in FIG. 16.
Figure 19:
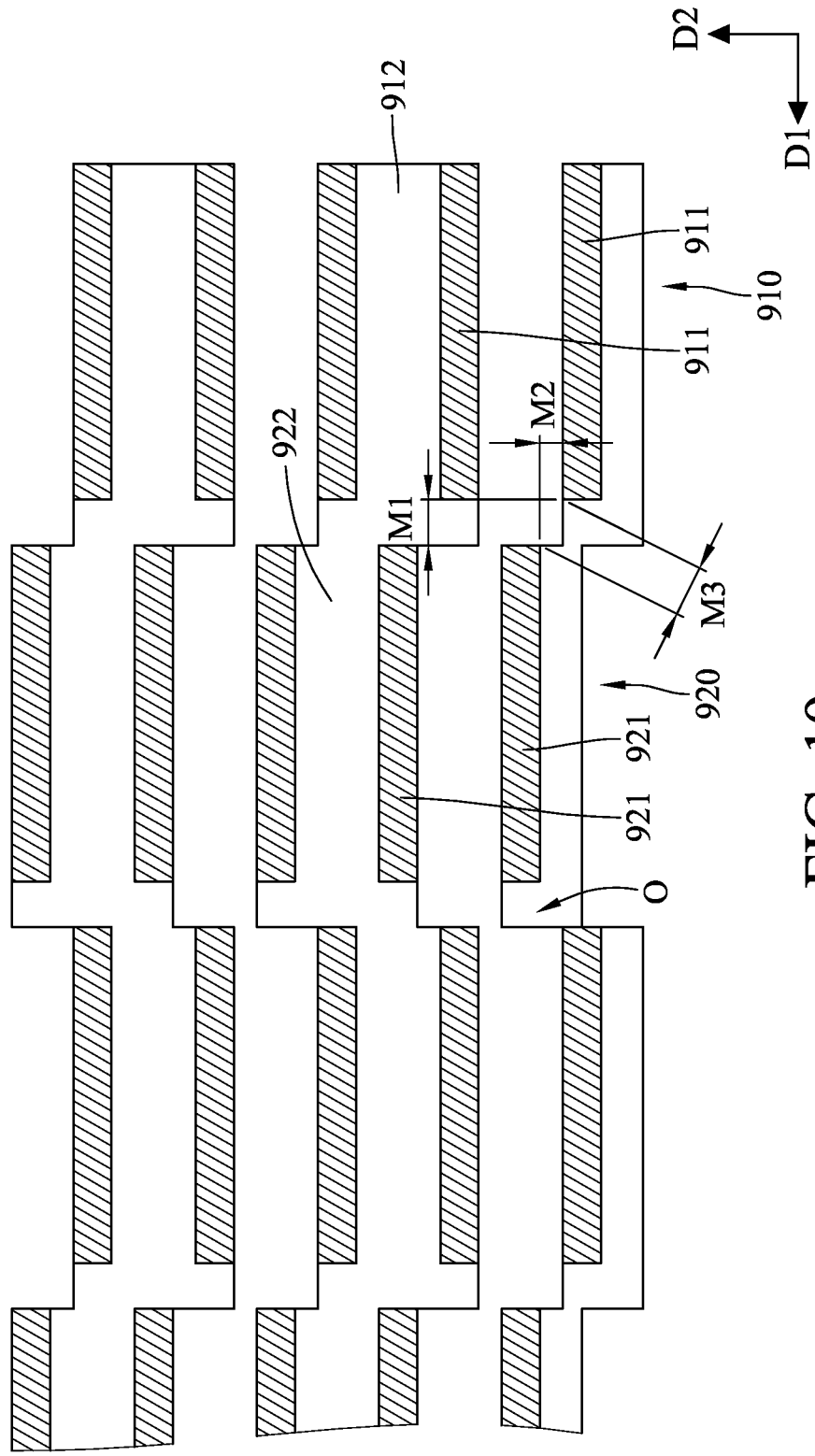
FIG. 19 is a partially enlarged cross-sectional top view of the heat dissipation device in FIG. 16.

Please refer to FIG. 16 to FIG. 19, FIG. 16 is a partially perspective view of a heat dissipation device according to a ninth embodiment of the present disclosure, FIG. 17 is a partially side view of the heat dissipation device in FIG. 16, FIG. 18 is a partially front view of the heat dissipation device in FIG. 16, and FIG. 19 is a partially cross-sectional top view of the heat dissipation device in FIG. 16.

As shown in FIG. 16 and FIG. 17, in this embodiment, the heat dissipation device 90 includes a plurality of first heat dissipation structures 910 and a plurality of second heat dissipation structures 920. The first heat dissipation structures 910 each include a plurality of first heat sinks 911, a plurality of first connection heat sinks 912 and a plurality of second connection heat sinks 913. The first heat sinks 911 are spaced apart from one another, they are connected through the first connection heat sinks 912 and second connection heat sinks 913. Specifically, as shown in the figure, to each first heat sink 911, the first connection heat sink 912 is connected to one side of the first heat sink 911, the second connection heat sink 913 is connected to the opposite side of the first heat sink 911, and the first connection heat sink 912 and the second connection heat sink 913 extend in opposite directions from the first heat sink 911 so as to connect the adjacent first heat sinks 911.

The second heat dissipation structures 920 each include a plurality of second heat sinks 921, a plurality of third connection heat sinks 922 and a plurality of fourth connection heat sinks 923. The second heat sinks 921 are spaced apart from one another, they are connected through the third connection heat sinks 922 and fourth connection heat sinks 923. Specifically, as shown in the figure, to each second heat sink 921, the third connection heat sink 922 is connected to one side of the second heat sink 921, the fourth connection heat sink 923 is connected to the opposite side of the second heat sink 921, and the third connection heat sinks 922 and the fourth connection heat sink 923 extend in opposite directions from the second heat sink 921 so as to connect the adjacent second heat sinks 921.

As shown in FIG. 18 and FIG. 19, the first heat dissipation structures 910 and the second heat dissipation structures 920 are alternatively disposed along a first direction D1, and the first heat sinks 911 are not respectively aligned with the second heat sinks 921 and are spaced from the second heat sinks 921 by a distance M1 in the first direction D1 so as to form an opening O therebetween. In addition, the first heat sinks 911 and the second heat sinks 921 are spaced apart by a distance M2 in a second direction D2 that is substantially orthogonal to the first direction D1. The opening O has a maximum distance M3, and the maximum distance M3 is larger than the distance M2 and is less than the sum of the distance M1 and the distance M2. And the maximum distance M3 is large enough to prevent particles from blocking the channel S, thereby securing a smooth flow of the fluid. For example, the particles may have a diameter of 0.5 to 0.6 mm, and the maximum distance M3 may be designed slightly larger than 0.60 mm. As a result, the particles can flow through the maximum distance M3 and the channel S may not be blocked. Therefore, it is no need to use the fewer first heat sinks 911 than convention, thus keeping the total surface area of the first heat sinks 911 in the channel S. Note that the actual value of the maximum distance M3 is not limited and can be altered in accordance with the size of the particles.

In this embodiment, the first connection heat sinks 912 are directly connected to the third connection heat sinks 922, and the second connection heat sinks 913 are directly connected to the fourth connection heat sinks 923, but the disclosure is not limited thereto. Please refer to FIG. 20 to FIG. 23, FIG. 20 is a partially enlarged perspective view of a heat dissipation device according to a tenth embodiment of the present disclosure, FIG. 21 is a partially enlarged side view of the heat dissipation device in FIG. 20, FIG. 22 is a partially enlarged front view of the heat dissipation device in FIG. 20, and FIG. 23 is a partially enlarged cross-sectional top view of the heat dissipation device in FIG. 20.

Figure 20:
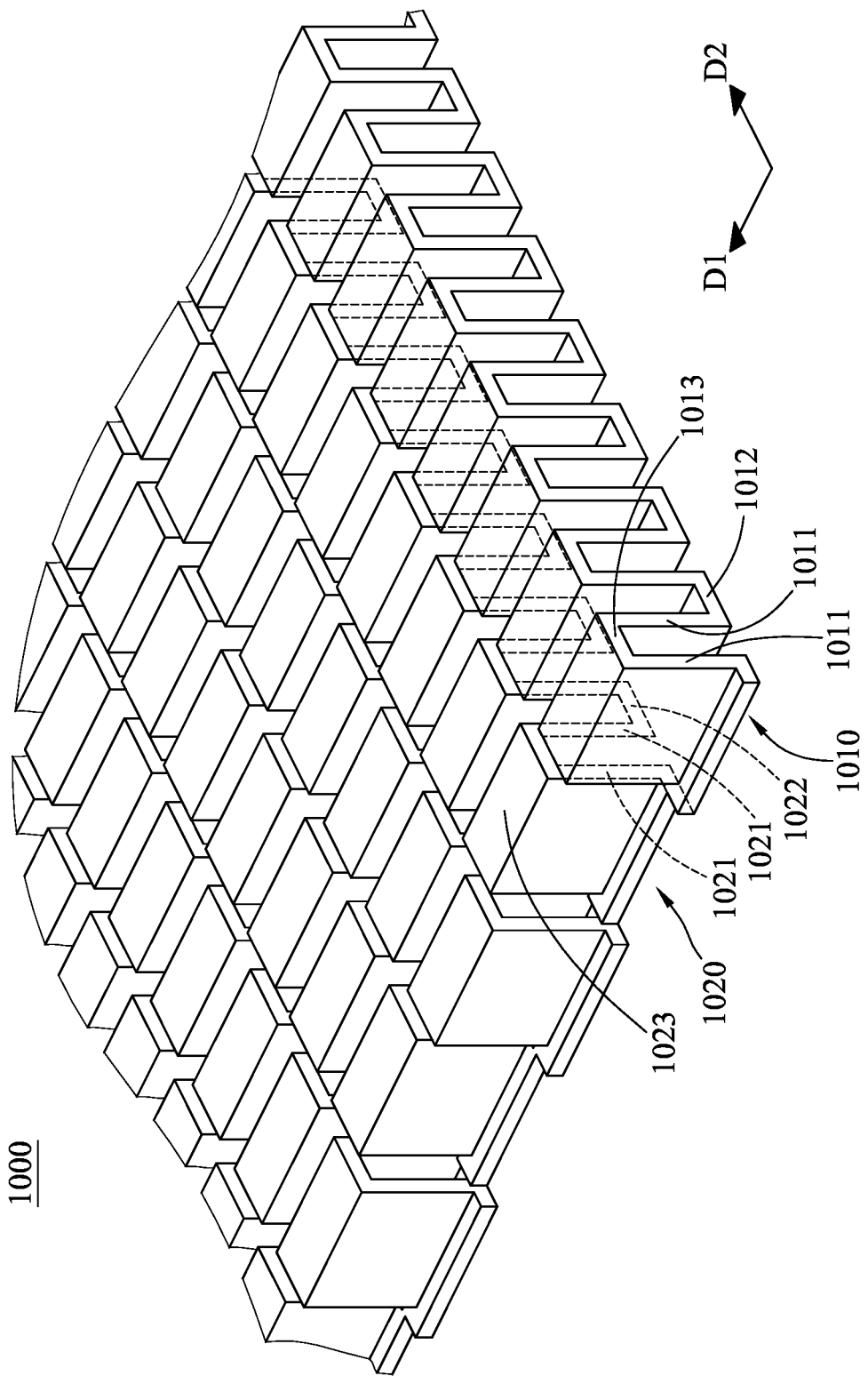
FIG. 20 is a partially enlarged perspective view of a heat dissipation device according to a tenth embodiment of the present disclosure.
Figure 21:
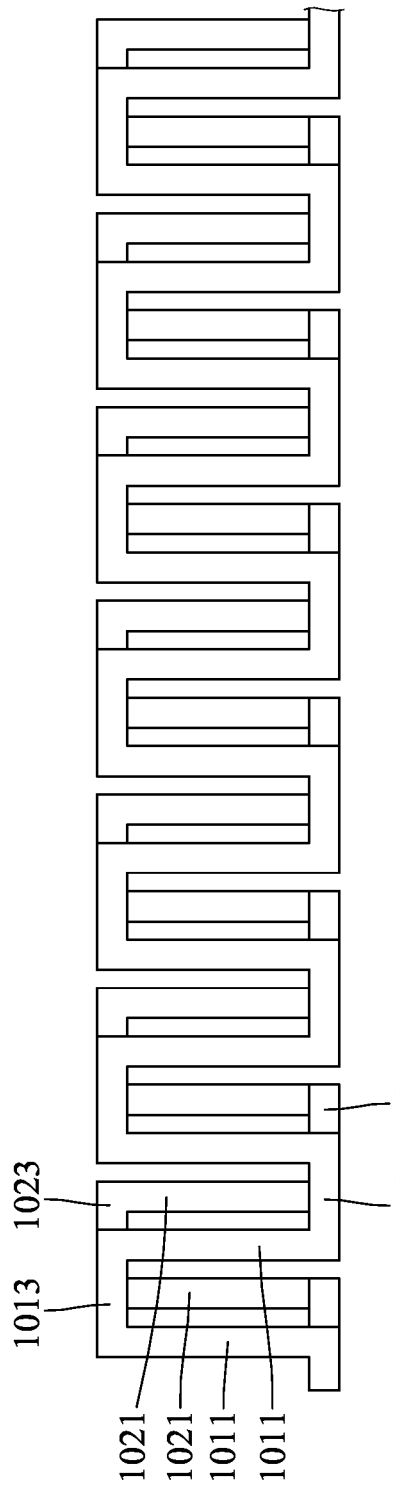
FIG. 21 is a partially enlarged side view of the heat dissipation device in FIG. 20.

As shown in FIG. 20 and FIG. 21, in this embodiment, the heat dissipation device 1000 includes a plurality of first heat dissipation structures 1010 and a plurality of second heat dissipation structures 1020. The first heat dissipation structures 1010 each include a plurality of first heat sinks 1011, a plurality of first connection heat sinks 1012 and a plurality of second connection heat sinks 1013. The first heat sinks 1011 are spaced apart from one another, they are connected through the first connection heat sinks 1012 and second connection heat sinks 1013. Specifically, as shown in the figure, to each first heat sink 1011, the first connection heat sink 1012 is connected to one side of the first heat sink 1011, the second connection heat sink 1013 is connected to the opposite side of the first heat sink 1011, and the first connection heat sink 1012 and the second connection heat sink 1013 extend in opposite directions from the first heat sink 1011 so as to connect the adjacent first heat sinks 1011.

The second heat dissipation structures 1020 each include a plurality of second heat sinks 1021, a plurality of third connection heat sinks 1022 and a plurality of fourth connection heat sinks 1023. The second heat sinks 1021 are spaced apart from one another, they are connected through the third connection heat sinks 1022 and fourth connection heat sinks 1023. Specifically, as shown in the figure, to each second heat sink 1021, the third connection heat sink 1022 is connected to one side of the second heat sink 1021, the fourth connection heat sink 1023 is connected to the opposite side of the second heat sink 1021, and the third connection heat sinks 1022 and the fourth connection heat sink 1023 extend in opposite directions from the second heat sink 1021 so as to connect the adjacent second heat sinks 1021.

Figure 22:
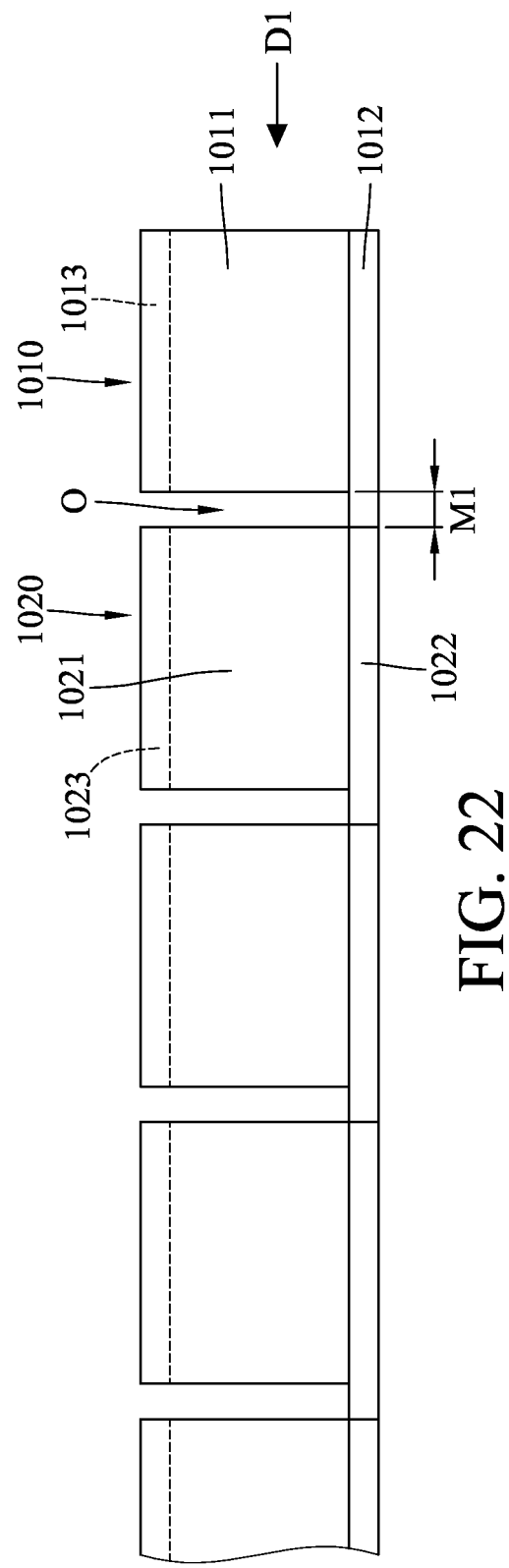
FIG. 22 is a partially enlarged front view of the heat dissipation device in FIG. 20.
Figure 23:
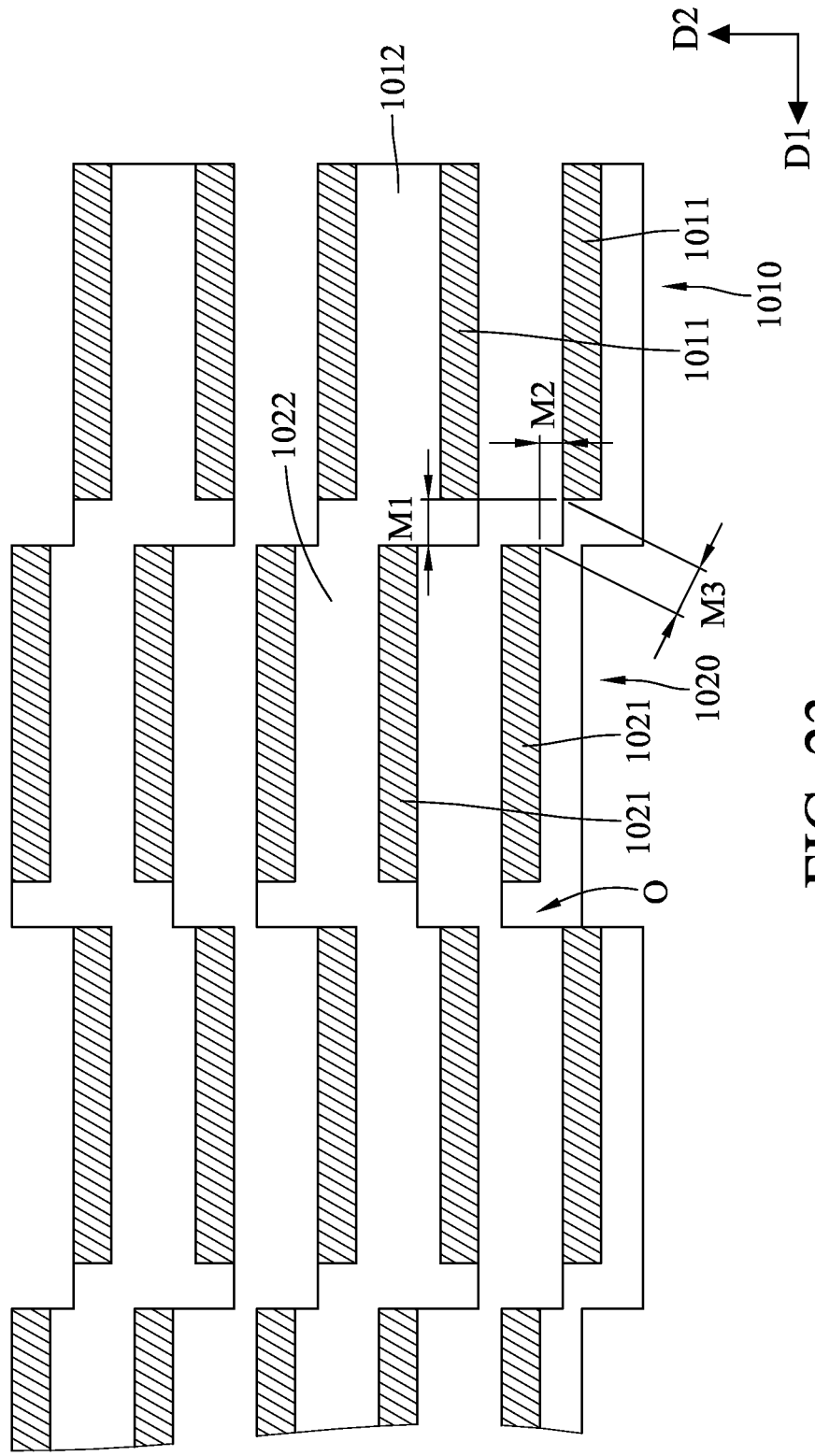
FIG. 23 is a partially enlarged cross-sectional top view of the heat dissipation device in FIG. 20.

As shown in FIG. 22 and FIG. 23, the first heat dissipation structures 1010 and the second heat dissipation structures 1020 are alternatively disposed along a first direction D1, and the first heat sinks 1011 are not respectively aligned with the second heat sinks 1021 and are spaced from the second heat sinks 1021 by a distance M1 in the first direction D1 so as to form an opening O therebetween. In addition, the first heat sinks 1011 and the second heat sinks 1021 are spaced apart by a distance M2 in a second direction D2 that is substantially orthogonal to the first direction D1. The opening O has a maximum distance M3, and the maximum distance M3 is larger than the distance M2 and is less than the sum of the distance M1 and the distance M2. And the maximum distance M3 is large enough to prevent particles from blocking the channel S, thereby securing a smooth flow of the fluid. For example, the particles may have a diameter of 0.5 to 0.6 mm, and the maximum distance M3 may be designed slightly larger than 0.60 mm. As a result, the particles can flow through the maximum distance M3 and the channel S may not be blocked. Therefore, it is no need to use the fewer first heat sinks 1011 than convention, thus keeping the total surface area of the first heat sinks 1011 in the channel S. Note that the actual value of the maximum distance M3 is not limited and can be altered in accordance with the size of the particles.

In this embodiment, the first connection heat sinks 1012 are directly connected to the third connection heat sinks 1022, but the second connection heat sinks 1013 are indirectly connected to the fourth connection heat sinks 1023.

According to the heat dissipation device and the fin structure discussed above, the minor structure protrudes from the main body and does not overlap with another main body. This configuration can cause the fluid to become a turbulent flow so as to increase the heat exchange efficiency.

Furthermore, in some embodiments, the diversion parts may be spaced apart from the side plates by different distances, which helps the fluid to form a turbulent flow in the gaps between the diversion parts and the side plates.

Also, the openings do not extend to the side plates. Therefore, the fin structure has a decent structural strength while having the configuration to achieve the above turbulent flow.

Moreover, the minor structures of the fin structures do not interfere with the adjacent main bodies, such that it would be easy and convenient to connect the fin structures and possible to modify the shape of the minor structure. The fin structures may be assembled by, for example, welding.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A heat dissipation device, comprising:
   at least one first heat dissipation structure, comprising a plurality of first heat sinks, a plurality of first connection heat sinks and a plurality of second connection heat sinks, wherein the plurality of first heat sinks are spaced apart from one another along a second direction, the plurality of first connection heat sinks are spaced apart from one another and are disposed only on a first side of the plurality of first heat sinks, the plurality of second connection heat sinks are spaced apart from one another and are disposed only on a second side of the plurality of first heat sinks, the plurality of first connection heat sinks and the plurality of second connection heat sinks protrude from the plurality of first heat sinks in opposite direction along the second direction, at least one of the plurality of second connection heat sinks has a flat upper surface lying in a horizontal plane, and the plurality of first connection heat sinks and the plurality of second connection heat sinks are spaced apart vertically in a third direction orthogonal to the horizontal plane; and at least one second heat dissipation structure, comprising a plurality of second heat sinks, a plurality of third connection heat sinks and a plurality of fourth connection heat sinks, wherein the plurality of second heat sinks are spaced apart from one another along the second direction, the plurality of third connection heat sinks are spaced apart from one another and are disposed only on a first side of the plurality of second heat sinks, the plurality of fourth connection heat sinks are spaced from one another and are disposed only on a second side of the plurality of second heat sinks, the plurality of third connection heat sinks and the plurality of fourth connection heat sinks protrude from the plurality of second heat sinks in opposite direction along the second direction, and the plurality of third connection heat sinks and the plurality of fourth connection heat sinks are spaced apart vertically in the third direction;

wherein the at least one first heat dissipation structure and the at least one second heat dissipation structure are alternatively disposed along a first direction that is perpendicular to the second direction and third direction, the plurality of first connection heat sinks and the plurality of third connection heat sinks are alternatively disposed along the first direction, and the plurality of first heat sinks are not respectively aligned with the plurality of second heat sinks, and a first distance along the first direction between one of the plurality of first heat sinks and one of the plurality of second heat sinks that is closest to the respective one of the plurality of first heat sinks is larger than a second distance along the second direction between the one of the plurality of first heat sinks and the one of the plurality of second heat sinks that is closest to the respective one of the plurality of first heat sinks, and any two adjacent of the first heat sinks are only connected by either the first connection heat sinks or the second connection heat sinks.

2. The heat dissipation device according to claim 1, wherein a shortest distance between one of the plurality of first heat sinks and one of the plurality of second heat sinks that is closest to the respective one of the plurality of first heat sinks is less than a sum of the first distance and the second distance.

3. The heat dissipation device according to claim 1, wherein the plurality of first connection heat sinks are respectively directly connected to the plurality of third connection heat sinks.

4. The heat dissipation device according to claim 3, wherein the plurality of second connection heat sinks are respectively directly connected to the plurality of fourth connection heat sinks.

* * * * *